(12) United States Patent
Huang et al.

(10) Patent No.: US 9,666,576 B2
(45) Date of Patent: May 30, 2017

(54) ELECTROSTATIC DISCHARGE (ESD) PROTECTION DEVICE

(71) Applicant: MediaTek Inc., Hsin-Chu (TW)

(72) Inventors: Chien-Kai Huang, Zhubei (TW); Yuan-Fu Chung, Changhua County (TW); Bo-Shih Huang, Hsinchu (TW); Chang-Tzu Wang, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/884,981

(22) Filed: Oct. 16, 2015

(65) Prior Publication Data

US 2016/0141285 A1    May 19, 2016

Related U.S. Application Data

(60) Provisional application No. 62/079,057, filed on Nov. 13, 2014.

(51) Int. Cl.
*H01L 27/02* (2006.01)
*H01L 29/861* (2006.01)
*H01L 29/06* (2006.01)

(52) U.S. Cl.
CPC ...... *H01L 27/0255* (2013.01); *H01L 27/0296* (2013.01); *H01L 29/0619* (2013.01); *H01L 29/0649* (2013.01); *H01L 29/8611* (2013.01)

(58) Field of Classification Search
CPC .............. H01L 27/0296; H01L 29/8611; H01L 27/0255; H01L 29/0649
USPC ........................................................ 257/478
See application file for complete search history.

(56) References Cited

U.S. PATENT DOCUMENTS

| | | | |
|---|---|---|---|
| 7,583,916 B2 * | 9/2009 | Ogata | G03G 15/0889 399/254 |
| 2005/0224917 A1 | 10/2005 | Gau | |
| 2006/0125014 A1 | 6/2006 | Chong et al. | |
| 2009/0050970 A1 | 2/2009 | Schneider et al. | |
| 2014/0070311 A1 * | 3/2014 | Yang | H01L 29/66689 257/335 |
| 2015/0364462 A1 * | 12/2015 | Nakaiso | H01L 27/0814 257/751 |

FOREIGN PATENT DOCUMENTS

JP    53132274    11/1998
JP    WO2014/132938    * 4/2014

* cited by examiner

*Primary Examiner* — Yasser A Abdelaziez
(74) *Attorney, Agent, or Firm* — McClure, Qualey & Rodack, LLP (57) ABSTRACT

An electrostatic discharge (ESD) protection device includes a semiconductor substrate and a pair of first well regions formed in the semiconductor substrate, wherein the pair of first well regions have a first conductivity type and are separated by at least one portion of the semiconductor substrate. In addition, the ESD protection device further includes a first doping region formed in a portion of the at least one portion of the semiconductor substrate separating the pair of first well regions, having a second conductivity type opposite to the first conductivity type. Moreover, the ESD protection device further includes a pair of second doping regions respectively formed in one of the first well regions, having the first conductivity type, and a pair of insulating layers respectively formed over a portion of the semiconductor substrate to cover a portion of the first doped region and one of the second doping regions.

14 Claims, 11 Drawing Sheets

ELECTROSTATIC DISCHARGE (ESD) PROTECTION DEVICE

CROSS REFERENCE TO RELATED APPLICATIONS

This application claims the benefit of U.S. Provisional Application No. 62/079,057 filed on Nov. 13, 2014, the entirety of which is incorporated by reference herein.

BACKGROUND OF THE INVENTION

Field of the Invention

The present invention relates to protection devices for integrated circuits (ICs), and in particular to electrostatic discharge (ESD) protection devices for integrated circuits (ICs).

Description of the Related Art

The semiconductor integrated circuit (IC) industry has experienced rapid growth. Technological advances in IC materials and design have produced generations of ICs where each generation has smaller and more complex circuits than the previous generation. These circuits may be sensitive to electrostatic discharge (ESD) currents. Thus, ESD protection devices are utilized to prevent and reduce damage to an IC caused by ESD currents. Traditionally, some ESD protection devices have parasitic capacitance that is large enough to noticeably degrade Radio Frequency (RF) performance in the circuit being protected.

Therefore, while existing ESD protection devices have been generally adequate for their intended purposes, they have not been entirely satisfactory in every aspect.

BRIEF SUMMARY OF THE INVENTION

An exemplary electrostatic discharge (ESD) protection device comprises a semiconductor substrate and a pair of first well regions formed in the semiconductor substrate, wherein the pair of first well regions have a first conductivity type and are separated by at least one portion of the semiconductor substrate. In addition, the ESD protection device further comprises a first doping region formed in a portion of the at least one portion of the semiconductor substrate separating the pair of first well regions, having a second conductivity type opposite to the first conductivity type. Moreover, the ESD protection device further comprises a pair of second doping regions respectively formed in one of the first well regions, having the first conductivity type, and a pair of insulating layers, respectively formed over a portion of the semiconductor substrate to cover a portion of the first doped region and one of the second doping regions.

In one embodiment, the exemplary ESD protection device further comprises a second well region formed in a portion of the semiconductor substrate under the pair of first well regions and the portion of the semiconductor substrate separating the pair of first well regions, wherein the second well region has the first conductivity type.

In another embodiment, the exemplary ESD protection device further comprises another first well region formed in a portion of the semiconductor substrate under the first doped region, such that the first well regions are separated from each other by a plurality of portions of the semiconductor substrate.

Another exemplary electrostatic discharge (ESD) protection device comprises a semiconductor substrate and a pair of first well regions formed in the semiconductor substrate, wherein the pair of first well regions have a first conductivity type and are separated by a portion of the semiconductor substrate. In addition, the ESD protection device further comprises a first doping region formed in a portion of the semiconductor substrate separating the pair of first well regions, having a second conductivity type opposite to the first conductivity type. Moreover, the ESD protection device further comprises a second well region formed in a portion of the semiconductor substrate separating the pair of first well regions and being under the first doped region, such that the first well regions are separated from each other by a plurality portions of the semiconductor substrate. In addition, the ESD protection device further comprises a pair of second doping regions formed in one of the pair of first well regions, respectively, having the first conductivity type. Moreover, the ESD protection device further comprises a pair of insulating layers respectively formed over a portion of the semiconductor substrate to cover a portion of the first doped region and one of the pair of second doping regions.

Yet another exemplary electrostatic discharge (ESD) protection device comprises a semiconductor substrate and a pair of first well regions formed in the semiconductor substrate, wherein the pair of first well regions have a first conductivity type and are separated by portion of the semiconductor substrate. In addition, the ESD protection device further comprises a first doping region formed in the portion of the semiconductor substrate separating the pair of first well regions, having a second conductivity type opposite to the first conductivity type. Moreover, the ESD protection device further comprises a plurality of second well regions separately formed in the portion of the semiconductor substrate under the first doping region, wherein each of the second well regions physically contacts the pair of the first well regions and has the first conductivity type, such that the first well regions are separated from each other by a plurality portions of the semiconductor substrate. In addition, the ESD protection device further comprises a pair of second doping regions respectively formed in one of the pair of first well regions, having the first conductivity type. Moreover, the ESD protection device further comprises a pair of insulating layers respectively formed over a portion of the semiconductor substrate to cover a portion of the first doped region and one of the pair of second doping regions.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined reference to the appended claims.

Figure 1:
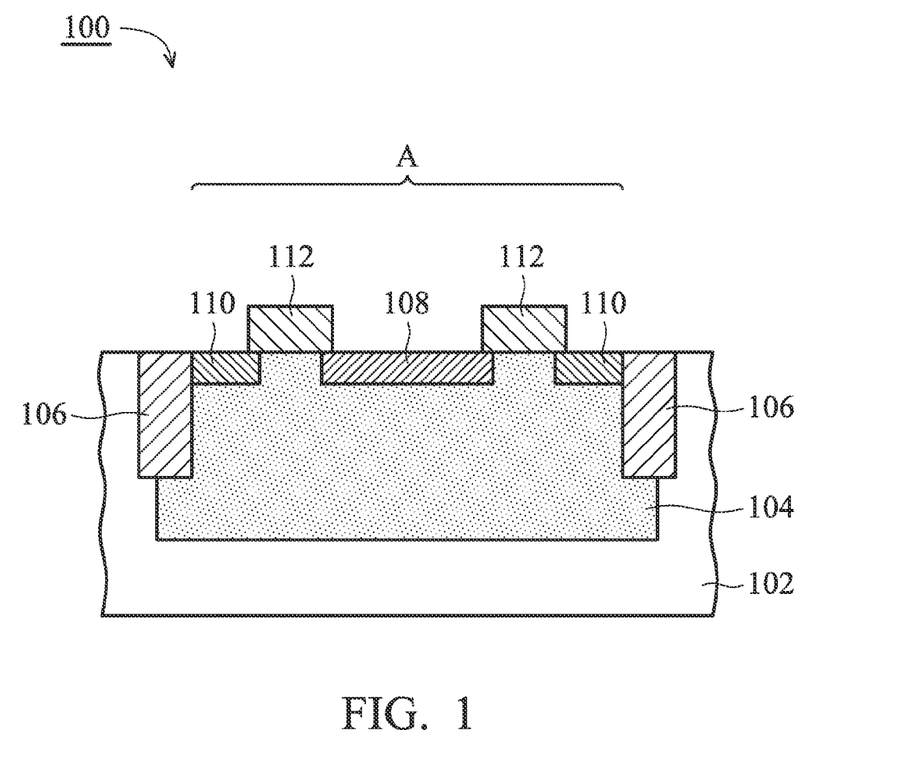
FIG. 1 is a schematic cross-sectional view of an electrostatic discharge (ESD) protection device according to an embodiment of the invention.

FIG. 1 is a schematic cross-sectional view showing an exemplary electrostatic discharge (ESD) protection device 100 which may be applied in integrated circuits (ICs) with radio frequency (RF) functions. The ESD protection device 100 shown in FIG. 1 is an embodiment for describing problems found by the inventors, and is not to limit the scope of the present application.

As shown FIG. 1, the ESD protection device 100 comprises a semiconductor substrate 102 and a well region 104 formed in a portion of the semiconductor substrate 102. In addition, a pair of isolation elements 106 are separately formed in a portion of the semiconductor substrate 102 and the well region 104 to define an active area A of the ESD protection device 100. In addition, a doped region 108 is formed in a middle portion of the well region 104, and a plurality of doped regions 110 are separately formed in one of the end portions of the well region 104, respectively. Moreover, a pair of insulating layers 112 are separately formed a portion of the well region 104, such that each of the insulating layers 112 is disposed over the portion of the well region 104 between the doped region 108 and one of the doped regions 110. Each of the insulating layers 112 covers and physically contacts a portion of the adjacent doped regions 108 and 110 and the portion of the well region 104 between the adjacent doped regions 108 and 110.

In one embodiment, the semiconductor substrate 102 can be, for example, a silicon substrate having a conductivity type such as p-type. In addition, the well region 104 and the doped regions 110 may have a first conductivity type such as N-type or P type, and the doped region 108 may have a second conductivity type opposite to the first conductivity type such as P-type or N-type. The dopant concentration in the doped regions 108 and 110 can be greater than that in the well region 104, and the dopant concentration in the well region 104 is greater than that of the semiconductor substrate 102. At this time, the ESD protection device 100 shown in FIG. 1 is thus provided with a diode structure having a P-N junction or an N-P junction formed between the doped region 108 and the well region 104. The doped region 108 can be a node to be electrically connected with a pad or circuit (both not shown), and each of the doped regions 110 can be another node to be electrically connected with a circuit or pad (both not shown). Therefore, the ESD protection device 100 can prevent or reduce damage caused by ESD currents to the circuit connected therewith.

However, given the trend of size reduction of ESD protection devices 100, the P-N or N-P junction formed between the doped region 108 and the well region 104 of an ESD protection device 100 may also be provided with increased parasitic capacitance to the degree that the parasitic capacitance is large enough to noticeably degrade the Radio Frequency (RF) performance of the integrated circuit connected therewith (not shown).

Figure 2:
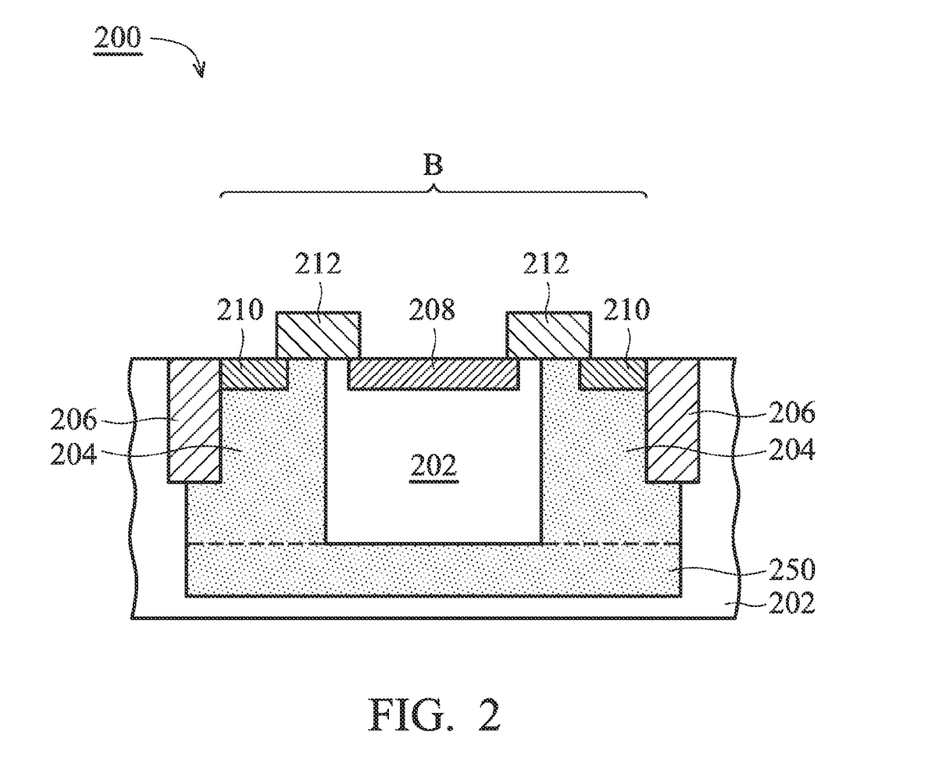
FIG. 2 is a schematic cross-sectional view of an electrostatic discharge (ESD) protection device according to another embodiment of the invention.
Figure 3:
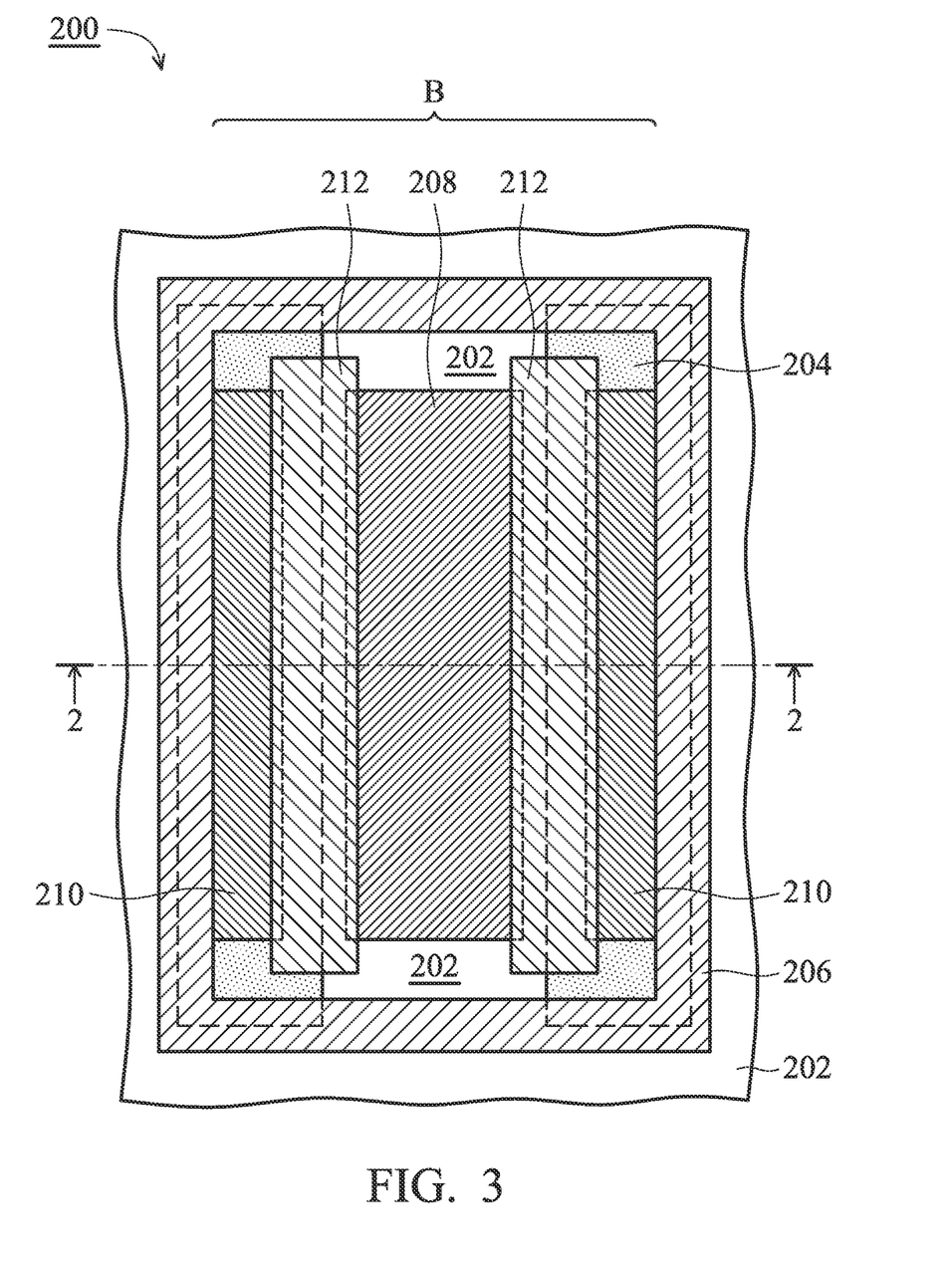
FIG. 3 is a schematic top view of the electrostatic discharge protection device shown in FIG. 2.

FIGS. 2-3 are schematic diagrams showing an exemplary electrostatic discharge (ESD) protection device 200 which may be applied to protect integrated circuits with radio frequency (RF) functions. FIG. 2 is a schematic cross-sectional view along line 2-2 in FIG. 3, and FIG. 3 is a schematic top view of the ESD protection device 200 shown in FIG. 2. The ESD protection device 200 shown in FIGS. 2-3 can be provided with a reduced parasitic capacitance and is also capable of providing ESD protection without degrading the radio frequency (RF) performance of the integrated circuit connected therewith (not shown) as the size of the ESD protection device 200 is reduced further.

As shown in FIG. 2, the exemplary ESD protection device 200 comprises a semiconductor substrate 202 and a pair of well regions 204 separately formed in a portion of the semiconductor substrate 202. The well regions 204 are isolated from each other by a portion of the semiconductor substrate 202 therebetween. In addition, an optional well region 250 is formed in a portion of semiconductor substrate 202 under the pair of well region 204 and the portion of the semiconductor substrate 202 formed between the well regions 204. Moreover, a pair of isolation elements 206 is separately formed in a portion of the semiconductor substrate 202 and the well regions 204 to define an active area B of the ESD protection device 200. In addition, a doped region 208 is formed in a middle portion of the portion of semiconductor substrate 202 formed between the well regions 204, and a plurality of doped regions 210 are separately formed in one of the end portions of the well regions 204, respectively. Moreover, a plurality of insulating layers 212 are separately formed over a portion of the well regions 204, such that each of the insulating layers 212 is disposed over the portion of the well region 204 and the portion of the semiconductor substrate 202 between the doped region 208 and one of the doped regions 210. Each of the insulating layers 212 covers and physically contacts a portion of the adjacent doped regions 208 and 210, the portion of the semiconductor substrate 202 between the adjacent doped regions 208 and 210, and the portion of the well region 204 between the adjacent doped regions 208 and 210.

In one embodiment, the semiconductor substrate 202 can be, for example, a silicon substrate having a conductivity type such as p-type. In addition, the well regions 204, the well region 250, and the doped regions 210 may have a first conductivity type such as N-type, and the doped region 208 may have a second conductivity type opposite to the first conductivity type such as P-type. The dopant concentration in the doped regions 208 and 210 is greater than that in the well regions 204 and 250, and the dopant concentration in the well regions 204 and 250 is greater than that in the semiconductor substrate 202.

In another embodiment, the semiconductor substrate 202 can be, for example, a silicon substrate having a conductivity type such as p-type. In addition, the well region 250 is omitted and the well regions 204 and the doped regions 208 may have a first conductivity type such as P type, and the doped region 208 may have a second conductivity type opposite to the first conductivity type such as N-type. At this time, the optional well region 250 can be omitted, and the dopant concentration in the doped regions 208 and 210 is greater than that in the well regions 204, and the dopant concentration in the well regions 204 is greater n that in the semiconductor substrate 202.

As shown FIG. 3, the portion of the semiconductor substrate 202 formed between the well regions 204 is provided with a stripe-like configuration from the top view. In addition, the well regions 204 and the doped regions 208 and 210 are also provided with a stripe-like configuration from the top view. The isolation elements 206 surround the well regions 204, the doped regions 208 and 210, and the portion of the semiconductor substrate 202 formed between the well regions 204.

At this time, the ESD protection device 200 shown in FIGS. 2-3 is provided with a diode structure having a P-N junction made of the portion of the semiconductor substrate 202 formed between the well regions 204 and the adjacent well regions 204, or an N-P junction made of the doped region 208 and the portion of the semiconductor substrate 202 formed between the well regions 204. Since the portion of the semiconductor substrate 202 between the plurality of the well regions 204 has a dopant concentration less than that of the doped region 208, the parasitic capacitance of the diode structure of the ESD protection device 200 shown in FIGS. 2-3 can be reduced. The doped region 208 can be a node electrically connected with a pad or a circuit (both not shown) and each of the doped regions 210 can be another lode electrically connected with a circuit or a pad (both not shown). Therefore, the ESD protection device 200 can prevent and reduce damage to the circuit connected therewith caused by ESD currents as the trend of size reduction of ESD protection devices 200 continues without noticeably degrading the radio frequency (RF) performance of the integrated circuits (not shown) connected therewith.

Figure 4:
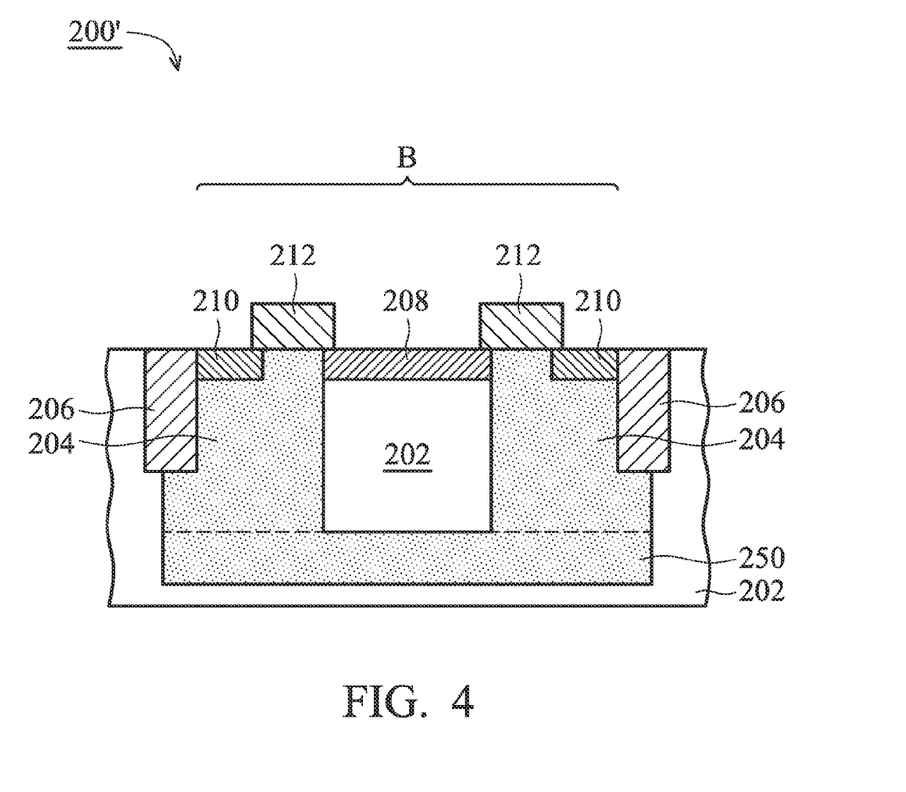
FIG. 4 is a schematic cross-sectional view of an electrostatic discharge (ESD) protection device according to yet another embodiment of the invention.
Figure 5:
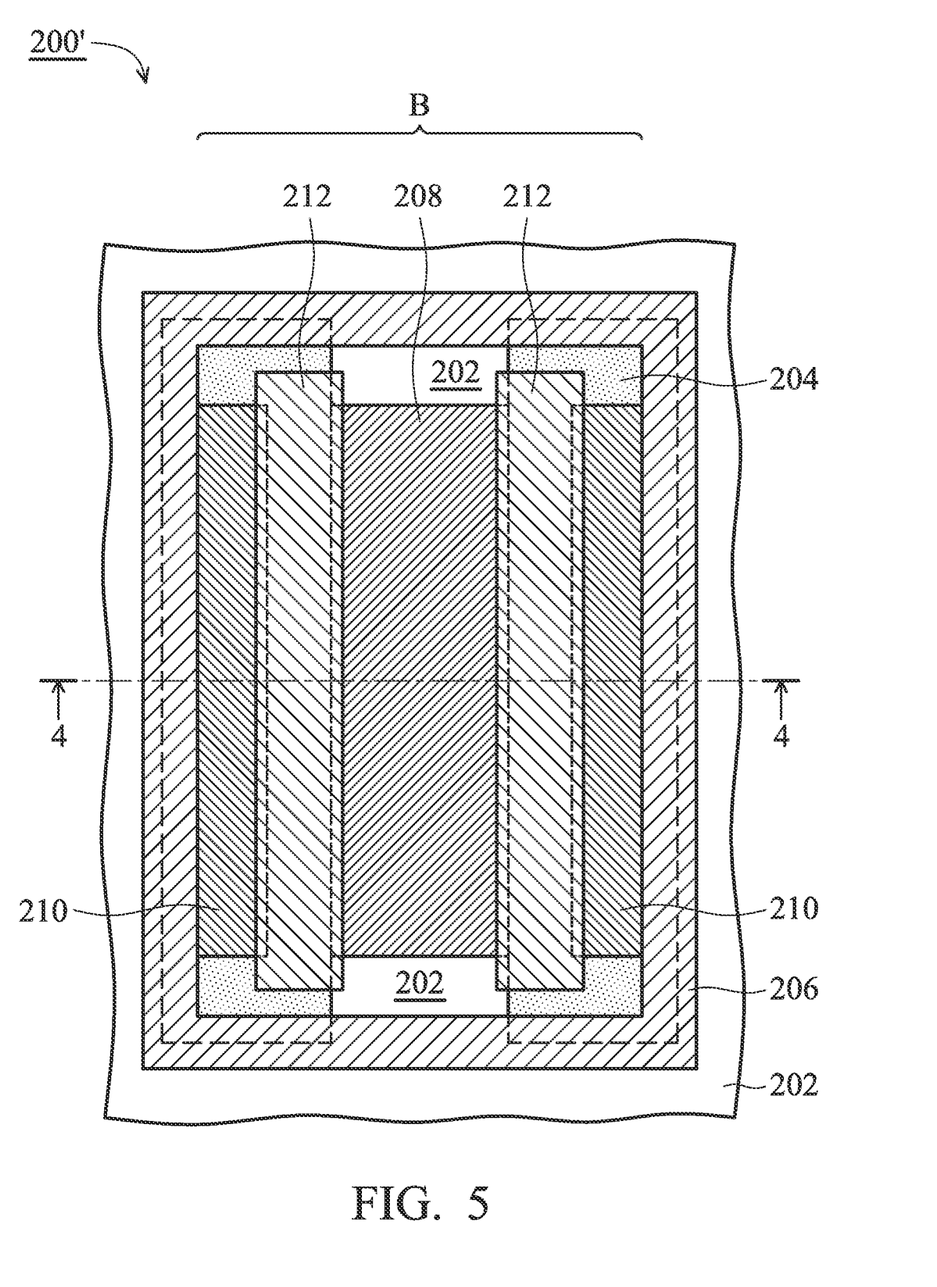
FIG. 5 is a schematic top view of the electrostatic discharge (ESD) protection device shown in FIG. 4.

FIGS. 4-5 are schematic diagrams showing another exemplary electrostatic discharge (ESD) protection device 200' which may be applied to protect integrated circuits with radio frequency (RF) functions. FIG. 4 is a schematic cross-sectional view along line 4-4 in FIG. 5, and FIG. 5 is a schematic top view of the ESD protection device 200 shown in FIG. 4. The ESD protection device 200' shown in FIGS. 4-5 is modified from the ESD protection device 200 shown in FIGS. 2-3, and only the differences therebetween are described below for the purpose of simplicity. The ESD protection device 200' shown FIGS. 4-5 can also be provided with reduced parasitic capacitance and are also capable of providing ESD protection without degrading the radio frequency (RF) performance of the integrated circuit connected therewith (not shown) as the size of the ESD protection device 200' is reduced further.

Unlike those in the ESD protection device 200 shown in FIGS. 2-3, the well regions 204 in the exemplary ESD protection device 200' shown in FIGS. 4-5 extend further toward the doped region 208, such that sidewalls of the doped region 208 physically contact a respective sidewall of each of the well regions 204, and the well regions 204 are still isolated from each other by the portion of the semiconductor substrate 200 formed under the doped region 208.

Figure 6:
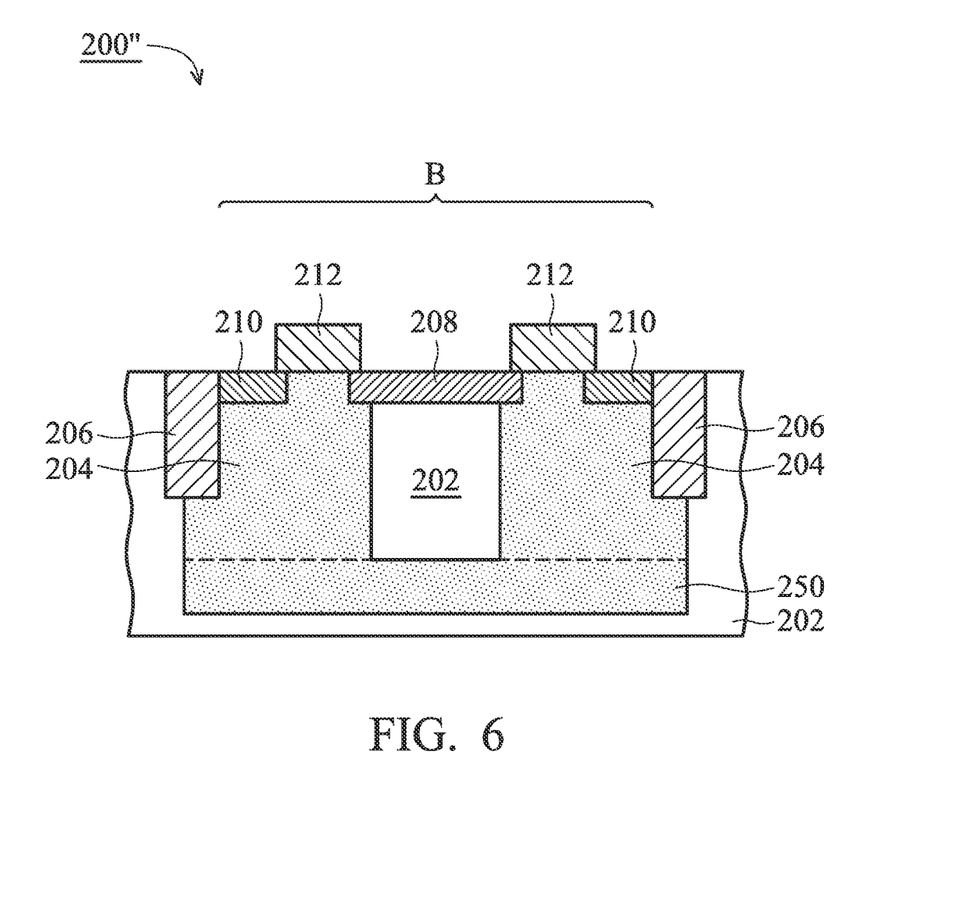
FIG. 6 is a schematic cross-sectional view of an electrostatic discharge (ESD) protection device according to another embodiment of the invention.
Figure 7:
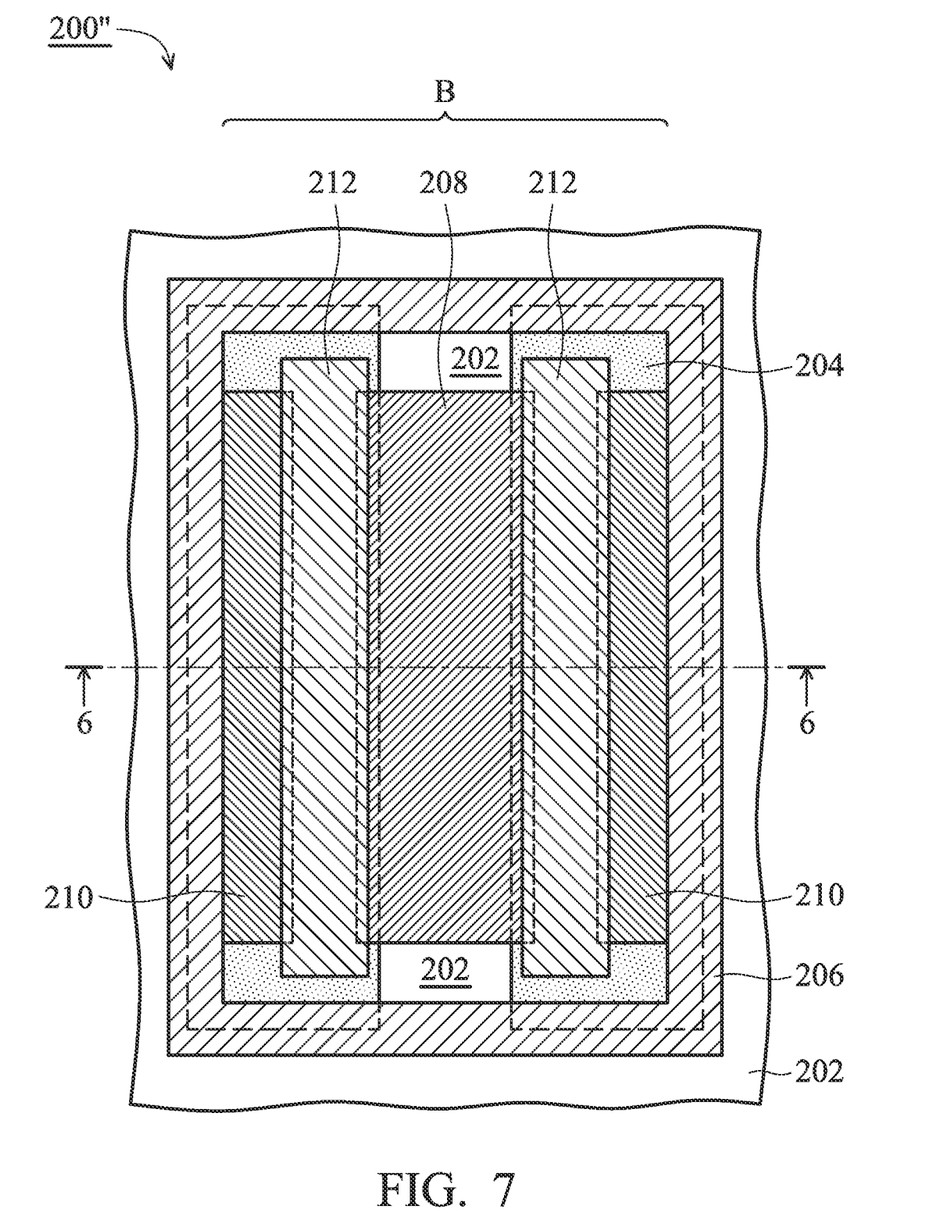
FIG. 7 is a schematic top view of the electrostatic discharge (ESD) protection device shown in FIG. 6.

FIGS. 6-7 are schematic diagrams showing another exemplary electrostatic discharge (ESD) protection device 200" which may be applied to protect integrated circuits with radio frequency (RF) functions. FIG. 6 is a schematic cross-sectional view along line 6-6 in FIG. 7, and FIG. 7 is a schematic top view of the ESD protection device 200" shown in FIG. 6. The ESD protection device 200" shown in FIGS. 6-7 is modified from the ESD protection device 200 shown in FIGS. 2-3, and only the differences therebetween are described herein for the purpose of simplicity. The ESD protection device 200" shown in FIGS. 6-7 can also be provided with reduced parasitic capacitance and are also capable of providing ESD protection without degrading the Radio Frequency (RF) performance of the integrated circuit connected therewith (not shown) as the size of the ESD protection device 200" is reduced further.

Unlike the exemplary ESD protection device 200 shown in FIGS. 2-3 the well regions 204 in the exemplary ESD protection device 200' shown in FIGS. 4-5 extend further toward and under a portion of the doped region 208, such that each of the well regions 204 physically contact a portion of sidewall and bottom surface of the doped region 208, but the well regions 204 are still isolated from each other by the portion of the semiconductor substrate 200 formed under doped region 208.

Figure 8:
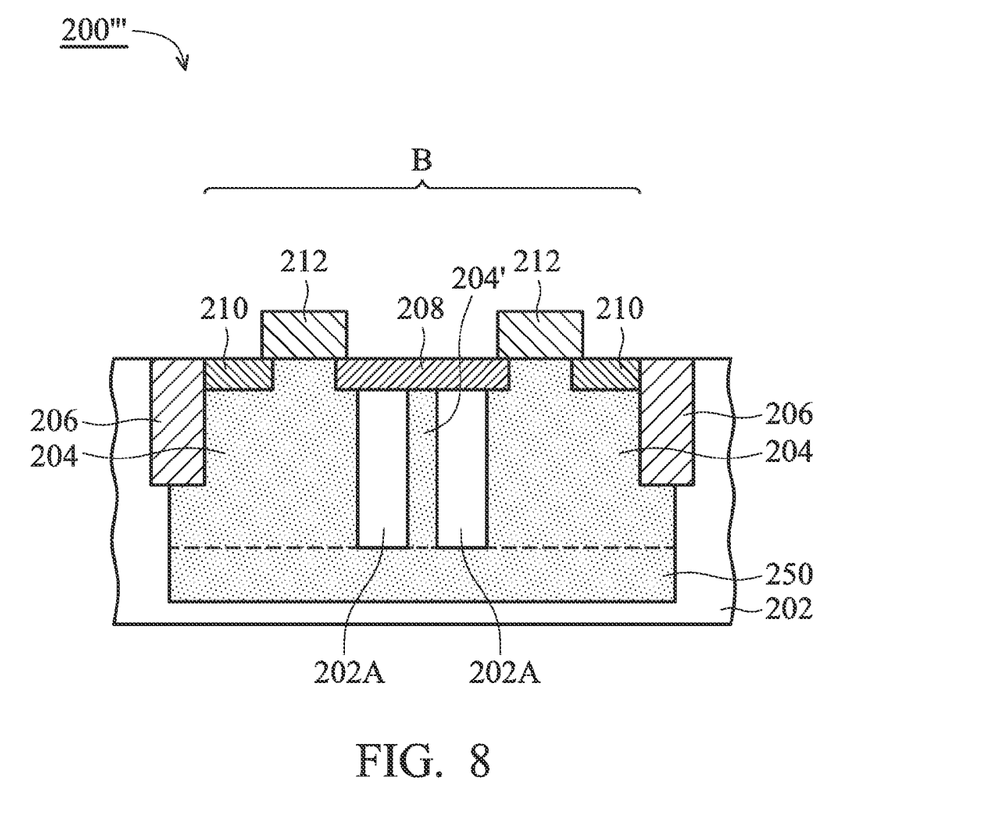
FIG. 8 is a schematic cross-sectional view of an electrostatic discharge (ESD) protection device according to yet another embodiment of the invention.
Figure 9:
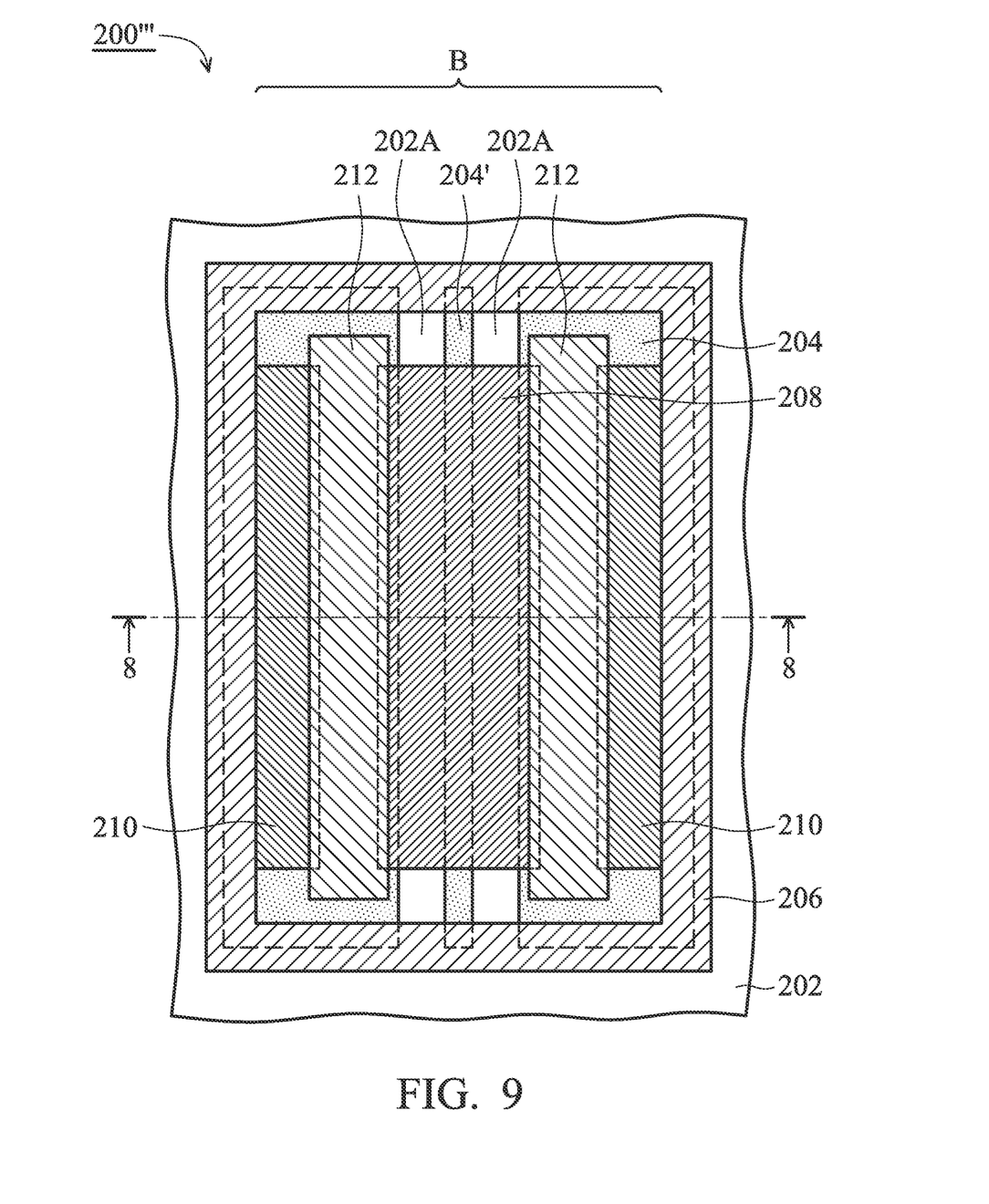
FIG. 9 is a schematic top view of the electrostatic discharge (ESD) protection device shown in FIG. 8.

FIGS. 8-9 are schematic diagrams showing another exemplary electrostatic discharge (ESD) protection device 200''' which may be applied to protect integrated circuits with radio frequency (RF) functions. FIG. 8 is a schematic cross-sectional view along line 8-8 in FIG. 9, and FIG. 9 is a schematic top view of the ESD protection device 200''' shown in FIG. 8. The ESD protection device 200''' shown in FIGS. 8-9 is modified from the ESD protection device 200" shown in FIGS. 6-7, and only the differences therebetween are described as below for the purpose of simplicity. The ESD protection device 200''' shown in FIGS. 8-9 can also be provided with reduced parasitic capacitance and are capable of providing ESD protection without degrading the Radio Frequency (RF) performance of the integrated circuit connected therewith (not shown) as the size of the e ESD protection device 200''' is reduced further.

Unlike the exemplary ESD protection de ice 200" shown in FIGS. 6-7, an additional well region 204' is formed in a portion of the portion of the semiconductor substrate 202 between the well regions 204 to separate the portion of the semiconductor substrate 202 between the well regions 204 into two sub-portions 202A. As shown in FIG. 9, the well region 204' and the sub-portions 202A are formed with a strip-like configuration. The well region 204' is the same as the well regions 204 and can be formed simultaneously during the fabrication of the well regions 204. In other embodiments, a plurality of additional well regions 204' can be formed in various portions of the portion of the semiconductor substrate 202 between the well regions 204 to separate the portion of the semiconductor substrate 202 between the well regions 204 into more than two sub-portions 202A (not shown), and the number of additional well regions 204' is not limited to that shown in FIGS. 8-9.

Similarly, in yet other embodiments, at least one additional well region 204' shown in FIGS. 8-9 can also be formed in a portion of the portion of the semiconductor substrate 202 between the well regions 204 shown in FIGS. 2-6 to separate the portion of the semiconductor substrate 202 between the well regions 204 into two or more sub-portions 202A, and the number of additional well regions 204' is not limited to that shown in FIGS. 8-9.

Figure 10:
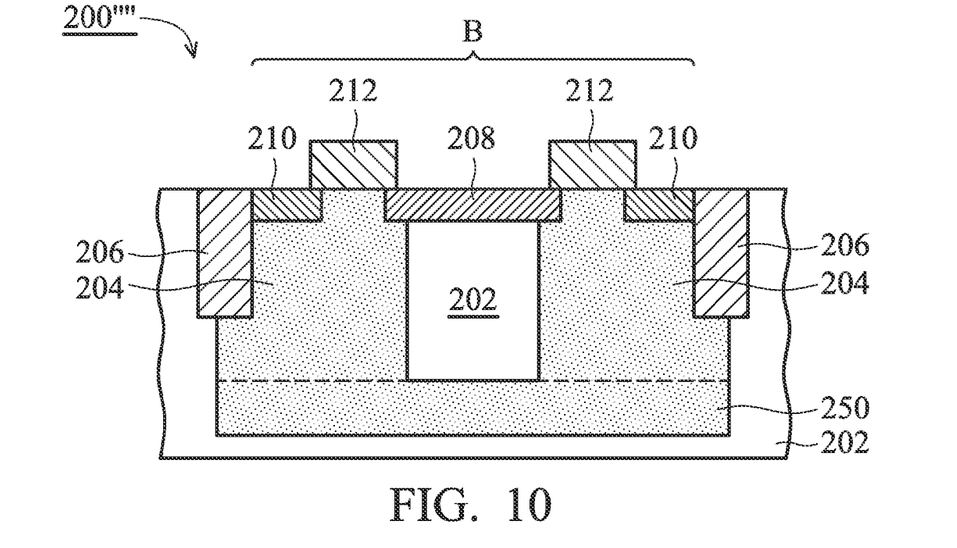
FIGS. 10-11 are schematic cross-sectional views of various portions of the electrostatic discharge (ESD) protection device according to another embodiment of the invention.
Figure 11:
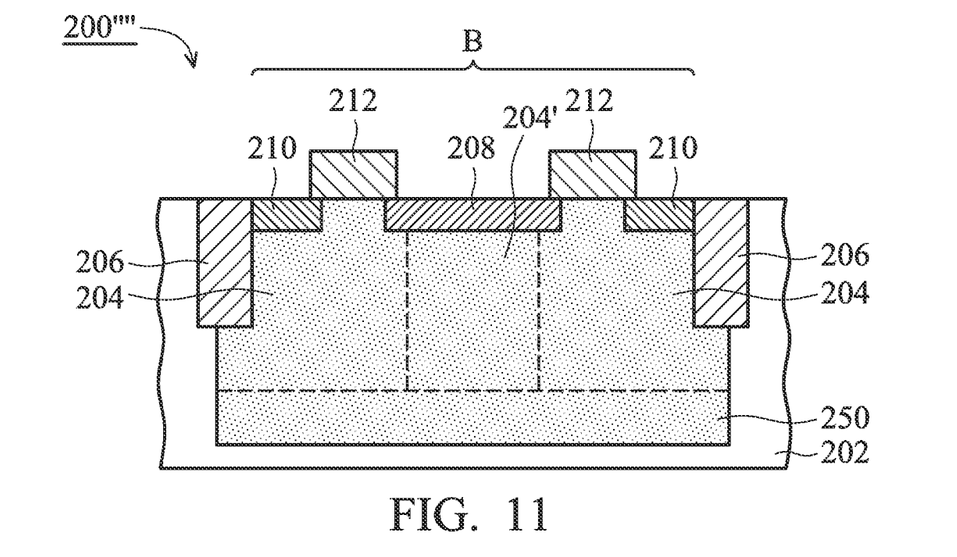
Figure 12:
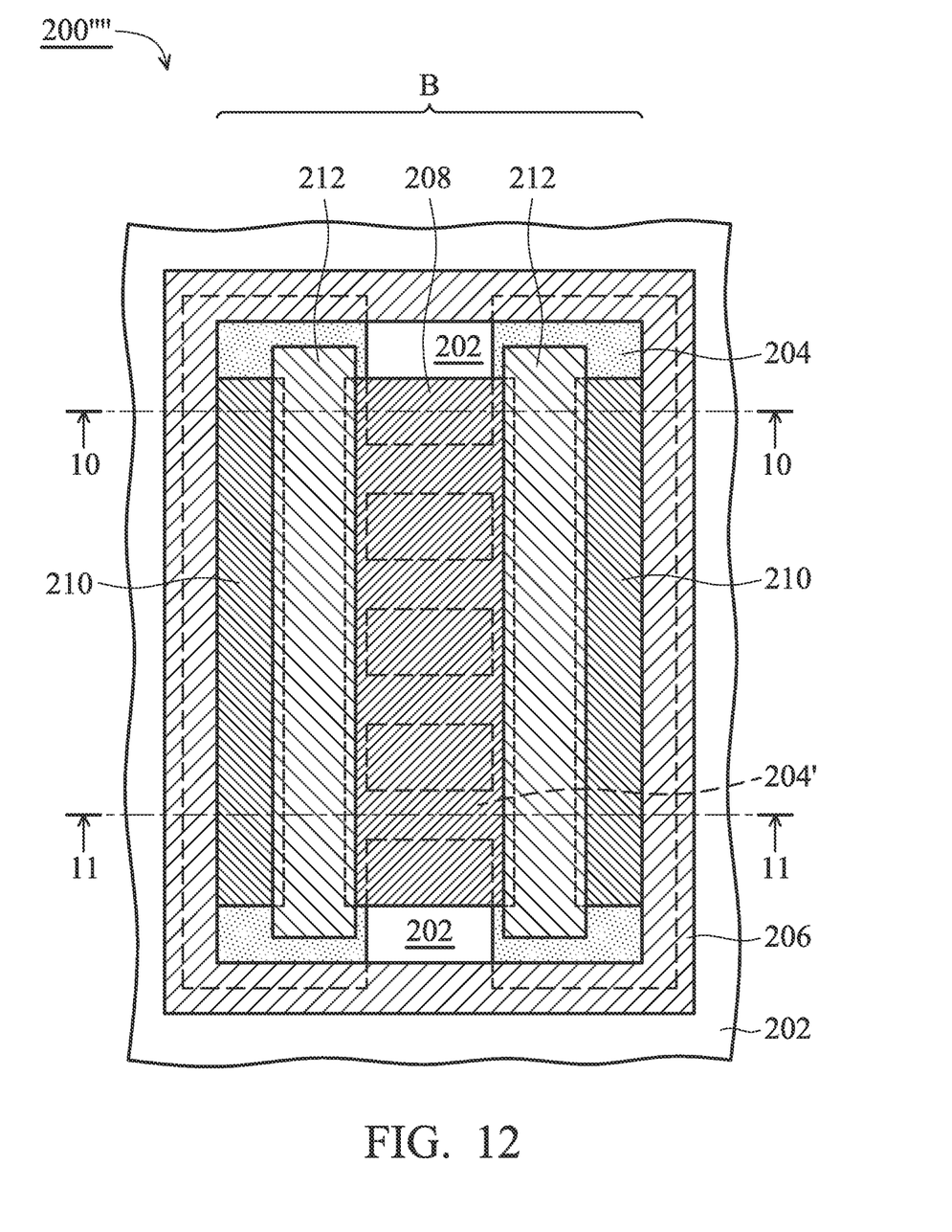
FIG. 12 is a schematic top view of the electrostatic discharge (ESD) protection devices shown in FIGS. 10-11.

FIGS. 10-12 are schematic diagrams showing yet another exemplary electrostatic discharge (ESD) protection device 200'''' which may be applied to protect circuits with radio frequency (RF) functions. FIG. 10 is a schematic cross-sectional view along line 10-10 in FIG. 12, FIG. 11 is a schematic cross-sectional view along line 11-11 in FIG. 12, and FIG. 12 is a schematic top view of the ESD protection device 200"" shown in FIGS. 10-11. The exemplary ESD protection device 200"" shown in FIGS. 10-12 is modified from the ESD protection device 200" shown in FIGS. 6-7, and only the differences therebetween are described below for the purpose of simplicity. The ESD protection device 200"" shown in FIGS. 10-12 can also be provided with reduced parasitic capacitance and are capable of providing an ESD protection function without degrading the Radio Frequency (RF) performance of the integrated circuit connected therewith (not shown) as the size of the ESD protection device 200"" is reduced further.

Unlike the exemplary ESD protection device 200" shown in FIGS. 6-7, the portion of the semiconductor substrate 202 between the well regions 204 is not formed in the stripe-like configuration from the top view but in a segment-like configuration from the top view. Therefore, a plurality of additional well regions 204' (see FIGS. 11 and 12) is formed in a portion of the portion of the semiconductor substrate 202 between the well regions 204 to separate the portion of the semiconductor substrate 202 between the well regions 204 into a plurality of isolated segments. The segments of well region 204' are the same as the well regions 204, and can be formed simultaneously during the fabrication of the well regions 204.

While the invention has been described by way of example and in terms of the preferred embodiments, it is to be understood that the invention s not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection (ESD) device, comprising:
    a semiconductor substrate;
    a pair of first well regions formed in the semiconductor substrate, wherein the pair of first well regions have a first conductivity type and are separated by at least one portion of the semiconductor substrate, which is adjacent to, extends between, and is in direct contact with, opposing lateral sides of the first well regions;
    a first doping region formed in a portion of at least one portion of the semiconductor substrate separating the pair of first well regions, having a second conductivity type opposite to the first conductivity type;
    a pair of second doping regions, each one of the second doping regions respectively formed in one of the pair of first well regions, having the first conductivity type;
    a pair of insulating layers, each one of the insulating layer respectively formed over a portion of the semiconductor substrate to cover a portion of the first doped region and one of the pair of second doping regions; and
    isolation structures formed on opposing outer sides of the pair of first well regions, the isolation structures surrounding the pair of first well regions, the first doping region, and the pair of second doping regions.

2. An electrostatic discharge protection (ESD) device, comprising:
    a semiconductor substrate;
    a pair of first well regions formed in the semiconductor substrate, wherein the pair of first well regions have a first conductivity type and are separated by at least one portion of the semiconductor substrate;
    a first doping region formed in a portion of at least one portion of the semiconductor substrate separating the pair of first well regions, having a second conductivity type opposite to the first conductivity type;
    a pair of second doping regions, respectively formed in one of the pair of first well regions, having the first conductivity type; and
    a pair of insulating layers, respectively formed over a portion of the semiconductor substrate to cover a portion of the first doped region and one of the pair of second doping regions, wherein the first conductivity type is P-type and the second conductivity type is N-type, and the semiconductor substrate has the first conductivity type.

3. The ESD device as claimed in claim 1, further comprising a second well region formed in a portion of the semiconductor substrate under the pair of first well regions and the at least one portion of the semiconductor substrate separating the pair of first well regions, wherein the second well region has the first conductivity type.

4. An electrostatic discharge protection (ESD) device, comprising:
    a semiconductor substrate;
    a pair of first well regions formed in the semiconductor substrate, wherein the pair of first well regions have a first conductivity type and are separated by at least one portion of the semiconductor substrate;
    a first doping region formed in a portion of at least one portion of the semiconductor substrate separating the pair of first well regions, having a second conductivity type opposite to the first conductivity type;
    a pair of second doping regions, respectively formed in one of the pair of first well regions, having the first conductivity type; and
    a pair of insulating layers, respectively formed over a portion of the semiconductor substrate to cover a portion of the first doped region and one of the pair of second doping regions, wherein the first conductivity type is N-type and the second conductivity type is P-type, and the semiconductor substrate has the second conductivity type.

5. The ESD device as claimed in claim 1, wherein the portion of the semiconductor substrate under the first doped region has a stripe-like configuration from a top view.

6. The ESD device as claimed in claim 1, wherein the portion of the semiconductor substrate under the first doped region comprises a plurality of separated segments from a top view.

7. The ESD device as claimed in claim 1, wherein the insulating layers are oxide layers.

8. The ESD device as claimed in claim 1, wherein a sidewall of the first doped region is physically isolated from a sidewall of the one of the pair of first well regions adjacent thereto.

9. The ESD device as claimed in claim 1, wherein a sidewall of the first doped region physically contacts a sidewall of the one of the pair of first well regions adjacent thereto.

10. The ESD device as claimed in claim 1, wherein the pair of first well regions further extends toward and under a portion of the first doped region, respectively, such that each of the pair of first well regions physically contacts a sidewall and a bottom surface of the portion of the first doped region adjacent thereto.

11. The ESD device as claimed in claim 1, further comprising another first well region formed in a portion of the semiconductor substrate under the first doped region, such that the first well regions are separated from each other by a plurality of portions of the semiconductor substrate.

12. The ESD device as claimed in claim 3, further comprising another first well region formed in the semiconductor substrate under the first doped region and in contact with the second well region, such that the first well regions are separated from each other by a plurality of portions of the semiconductor substrate.

13. The ESD device as claimed in claim 1, further comprising an isolation element disposed in a portion of the semiconductor substrate adjacent to a side of each of the first well regions not adjacent to the first doped region.

14. The ESD device as claimed in claim 13, wherein the isolation element is a shallow trench isolation (STI) element.

* * * * *